Nov. 11, 1958 E. JAKUBOWICS 2,860,246

FREQUENCY CONTROL SYSTEM

Filed July 8, 1955

INVENTOR.
EDWARD JAKUBOWICS

BY
Harry M. Saragovitz
ATTORNEY

United States Patent Office 2,860,246

Patented Nov. 11, 1958

2,860,246

FREQUENCY CONTROL SYSTEM

Edward Jakubowics, Red Bank, N. J., assignor to the United States of America as represented by the Secretary of the Army

Application July 8, 1955, Serial No. 520,939

1 Claim. (Cl. 250—36)

(Granted under Title 35, U. S. Code (1952), sec. 266)

The invention described herein may be manufactured and used by or for the Government for governmental purposes, without the payment of any royalty thereon.

The invention relates to a frequency control system and more particularly to a system for controlling the frequency of a variable frequency oscillator used as heterodyning oscillations in a heterodyne receiver or as an exciter-oscillator in a transmitter.

Certain applications of communication transmitter-receivers require that the radio transmitter and receiver be capable of extremely rapid tuning to any preselected one of a large number of radio-frequency channels. In such systems, a variable frequency oscillator is usually employed and it is necessary to control the output frequency thereof to such a degree of accuracy that it would approach crystal stability. Heretofore such frequency control circuits required rather complicated circuitry and the use of numerous selectively tuned circuits.

An object of the present invention is to provide an improved frequency control system for an oscillator adapted to be changed through a wide frequency range in a multiplicity of steps equally spaced in frequency.

It is another object of this invention to provide an improved frequency control system wherein the output frequency of a variable frequency oscillator is maintained in stable operation at any preset frequency within a prescribed frequency range.

It is yet another object of the present invention to provide an improved frequency control system for a variable frequency oscillator wherein no variable tuned circuits are required.

In accordance with the present invention there is provided a system for controlling the output from a variable frequency oscillator adapted to operate through a prescribed range having discrete frequency channel spacing by means of the output from a frequency discriminator responsive only to frequency deviation from a prescribed center frequency. Included are means for simultaneously generating a basic frequency and a plurality of frequencies harmonically related thereto. Also included is a first heterodyning means responsive to the output of the harmonic generator means and the output of the variable frequency oscillator whereby there is produced a first intermediate frequency. For one half of the variable frequency output range, one of the harmonic frequencies and the preset variable frequency add to form the first intermediate frequency and for the other half of the variable output frequency range, the first intermediate frequency is derived from the difference between one of the harmonic frequencies and the preset variable frequency. Included further is a crystal-controlled frequency generating means for producing a spectrum having said discrete frequency channel spacing and including means for selectively utilizing any one frequency within the spectrum. Also provided is a second heterodyning means responsive to the first intermediate frequency and a selected crystal-generated frequency to produce a second intermediate frequency which is applied to the frequency discriminator. The frequency discriminator will produce an output voltage to control the frequency output of the variable frequency oscillator only when the second intermediate frequency deviates from the prescribed center frequency.

For a better understanding of the invention, together with other and further objects thereof, reference is had to the following description taken in connection with the accompanying drawing in which.

Figure 1:
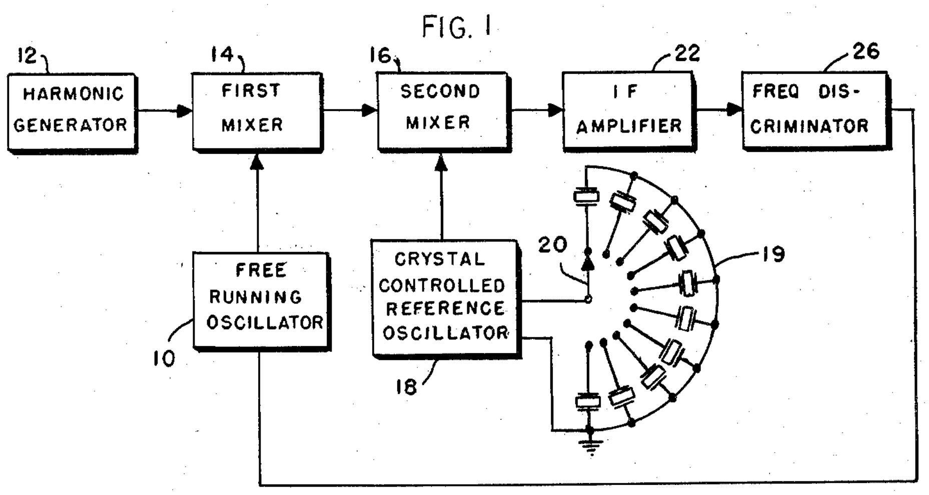
Fig. 1 is a block diagram illustrating the frequency control system.

Referring now to Fig. 1 of the drawing, at 10 there is shown a variable frequency or free-running oscillator adapted to operate at a plurality of substantially uniformly spaced frequencies over a prescribed range. The output of oscillator 10 may be used as heterodyning oscillations in a superheterodyne receiver or as an exciter in a transmitter, and the operating frequency thereof is to be stabilized by the system of this invention. At 12 there is shown an harmonic generator adapted to simultaneously generate an harmonic frequency spectrum effective for heterodyning purposes up to at least the twenty-fifth harmonic of a fundamental or basic frequency which is a prescribed multiple of the desired frequency spacing of the oscillation output frequency. One type of harmonic generator well suited for this purpose is the crystal controlled multivibrator described in Baatan Patent No. 2,070,647. The pulsed wave output of such a multivibrator will provide the required harmonic spectrum for the operation of my invention. The output from harmonic generator 12 is heterodyned with the output of oscillator 10 in a first mixer 14 having a selective output circuit tuned to be responsive only to a first prescribed intermediate frequency. The operating frequency range of oscillator 10 is such that for one-half of its range the first prescribed intermediate frequency is derived from the sum of the discrete output frequency from oscillator 10 and one of the simultaneously generated harmonic frequencies, and for the other half of its range, the first intermediate frequency is derived from the difference between the output of oscillator 10 and one of the harmonic frequencies. By this arrangement each discrete harmonic frequency output from generator 12 is used twice. The output circuit of first mixer 14 is tuned sufficiently broad to provide a minimum bandwidth which is equal to the periodic or basic frequency from harmonic generator 12. For example, if the periodic frequency from generator 12 is 500 kilocycles then the output circuit of first mixer 14 is tuned to pass a minimum bandwidth of 500 kilocycles. The intermediate-frequency output of first mixer 14 is heterodyned with the frequency output from a reference oscillator 18 in a second mixer 16 to produce a second prescribed intermediate frequency. Reference frequency oscillator 18 is adapted to provide selective discrete crystal-controlled, uniformly spaced, frequencies, hereinafter referred to as interpolation frequencies, having the same frequency spacing as that of oscillator 10. For the embodiment shown in Fig. 1 each interpolation frequency is controlled by one of the ten crystals shown at 19 selected for operation through switch 20. For the system shown in Fig. 1 it is assumed that the spacing of the output from variable oscillator 10 is 50 kilocycles so that for each 500-kilocycle spacing (ten settings), ten discrete interpolation frequencies are selectively applied from oscillator 18 to produce the second prescribed intermediate frequency in the output of second mixer 16 as the output variable frequency oscillator 10 is varied in 50-kilocycle steps over its range of operation. It is to be understood of course that the number of crystal-controlled interpolation frequencies is not to be limited to 10 but that any other suitable number of crystal-controlled frequencies may be used depending on the minimum channel spacing in variable oscillator 10 and the basic frequency from generator 12. For example, if 50-kilocycle channel spacing is desired and the basic frequency of harmonic generator 12 is 500 kilocycles, then ten interpolation frequencies will be used. For a basic frequency of 1 megacycle, and 25-kilocycle channel spacing, 40 interpolation frequencies will be used.

The second prescribed intermediate frequency output is applied through several cascaded intermediate frequency amplifiers 22 to a frequency discriminator 26 which is centered at or tuned to the second prescribed intermediate frequency. Discriminator 26 provides a direct-current output of a polarity and magnitude depending upon the sense and amount of difference between the center frequency and the frequency of the input to such discriminator.

Figure 2:
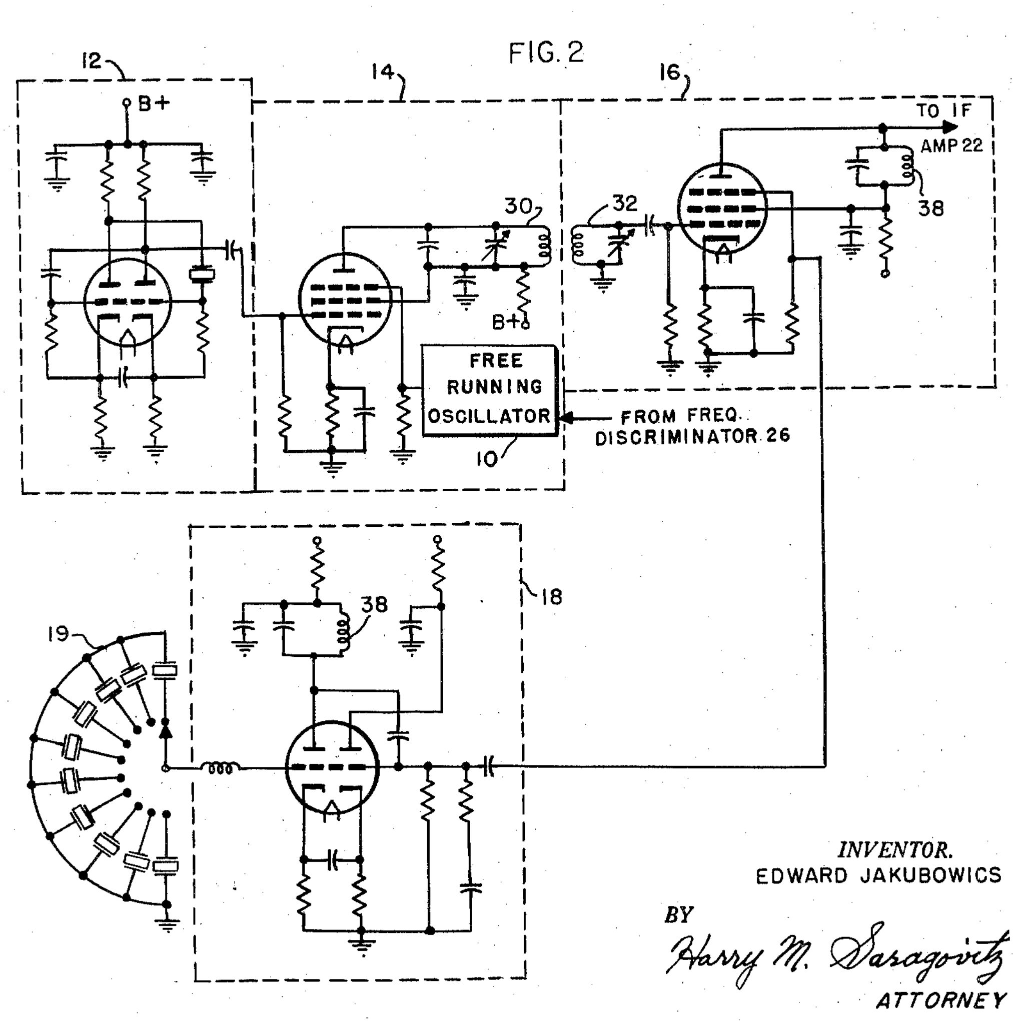
Fig. 2 is a schematic diagram of the frequency determining components of the system shown in Fig. 1.

Referring now to the schematic diagram of Fig. 2, the output of harmonic generator 12 is shown connected directly to the control grid of first mixer 14 and the output of variable frequency oscillator 10 is applied directly to the suppressor grid of first mixer 14. The first prescribed intermediate frequency is generated in the tuned output circuit 30 of first mixer 14 which is in coupling arrangement with the tuned input circuit 32 connected to the control grid of second mixer 16. The output of crystal controlled reference oscillator 18 is applied directly to the suppressor grid of second mixer 16 to heterodyne with the first intermediate frequency thereby producing the second intermediate frequency. As shown, the tuned output circuit between the plate and screen grid of second mixer 16 comprises a single tuned output circuit 38 which has a bandpass such that it is responsive to the total spacing of the interpolation frequencies which is a measure of the maximum permissible error frequency in the settings of oscillator 10. The remainder of the system including the intermediate frequency amplifiers 22 and frequency discriminator 26 are conventional and hence no description thereof is believed necessary.

In discussing the operation of the invention, let it be assumed that fre-running oscillator 10 is to operate over a 25-megacycle range between 32.5 and 57.5 megacycles with 50-kilocycle spacing between operating frequencies. Furthermore, it is to be assumed that the fundamental frequency of harmonic generator 12 is 500 kilocycles and that frequencies up to and including the twenty-fifth harmonic of the 500-kilocycle fundamental frequency are effective for heterodyning. Thus the available output from harmonic generator 12 will comprise available harmonic frequencies up to at least 12.5 megacycles spaced 0.5 megacycle apart. The first intermediate frequency tuned circuits 30 and 32 are to be tuned to 45.225 megacycles and designed to have a bandpass of substantially 0.5 megacycle as explained hereinabove. The ten interpolation reference frequencies are assumed to vary from 43.25 megacycles to 43.70 megacycles in 50 kilocycle steps and to heterodyne with the first intermediate frequency to produce a second intermediate frequency of 1.75 megacycles when the output of oscillator 10 is at the discrete frequency setting which is desired to be stabilized or controlled. Discriminator 26 is tuned or centered at 1.75 megacycles so that any frequency deviation from 1.75 will produce a correction voltage which is applied to oscillator 10. The choice of the first intermediate frequency is dependent upon the range of operation of variable oscillator 10 while the second intermediate frequency is chosen to provide effective discriminator action and yet minimize the effect of spurious responses.

Assuming that the desired operating frequency of oscillator 10 is 32.5 megacycles, it is obvious that this output frequency will heterodyne only with the twenty-fifth harmonic, that is, 12.5 megacycles, from generator 12 to produce the first intermediate frequency of 45 megacycles which is substantially the center frequency of the 25 megacycle range through which oscillator 10 is adapted to operate. It is to be noted that in this instance the sum of the two heterodyning frequencies is used to produce the 45-megacycle intermediate frequency and this will hold true for the first half of the output range from oscillator 10. For the second half of the output range from oscillator 10, the difference between the two heterodyning frequencies is utilized to produce the 45-megacycle intermediate frequency. For example, the 57-megacycle output from oscillator 10 will combine only with the twenty-fourth harmonic, that is, 12 megacycles, from generator 12 to produce the 45-megacycle intermediate frequency. The first intermediate frequency is heterodyned with one of the interpolation frequencies in the second mixer 16 to produce the second intermediate frequency of 1.75 megacycles. For each 500-kilocycle range of output frequencies from oscillator 10 there will be provided ten interpolation frequencies to produce the second intermediate frequency of 1.75 megacycles. For example, the operating range of 32.5 megacycles through 32.95 megacycles is heterodyned with the same twenty-fifth harmonic (12.5 mc.) to produce a first intermediate frequency spaced 50 kilocycles apart which varies from 45.0 to 45.45 megacycles. To produce the second intermediate frequency of 1.75 megacycles, interpolation frequencies from reference oscillator 18 will correspondingly be varied from 43.25 to 43.70 megacycles.

To illustrate the control feature of the invention, let it be assumed that the output from oscillator 10 has been set at 40 megacycles so that it combines with the tenth harmonic, i. e., 5 megacycles, from generator 12 to produce the first intermediate frequency of 45 megacycles and the reference frequency is set at 43.25 megacycles to produce the second intermediate frequency of 1.75 megacycles. If the output should drift to say 40.02 megacycles, then the first intermediate frequency of 45.02 megacycles will heterodyne with 43.25 megacycles to provide a second intermediate frequency of 1.77 megacycles. Inasmuch as frequency discriminator 26 is tuned to the center frequency of 1.75 megacycles, the difference between 1.77 megacycles and 1.75 megacycles will cause the discriminator 26 to generate a direct-current voltage having a polarity such that when applied to oscillator 10, it will correct the output frequency thereof so that it will be at the correct frequency of 40 megacycles.

While there have been described what are at present considered to be the preferred embodiments of this invention, it will be obvious to those skilled in the art that various changes and modifications may be made therein without departing from the invention, and it is, therefore, aimed in the appended claim to cover all such changes and modifications as fall within the true spirit and scope of the invention.

What is claimed is:

In a system wherein a selected output from a variable frequency oscillator operative through a prescribed range having discrete frequency channel spacing is controlled by the output of a frequency discriminator responsive only to frequency deviations from a prescribed center frequency, harmonic generating means for simultaneously generating a fundamental frequency and a plurality of frequencies harmonically related thereto, said fundamental frequency being a multiple of the channel spacing of said variable frequency oscillator, a first heterodyning means responsive to the output of said harmonic generating means and the output of said variable frequency oscillator and having a tuned output circuit adapted to pass only a single intermediate frequency resulting from the combining of one of the harmonic frequencies with a controlled output from said variable frequency oscillator, said single intermediate frequency being substantially at the center of the prescribed range of the output of said variable frequency oscillator, crystal controlled frequency generating means for producing a spectrum of oscillation frequencies having said discrete frequency channel spacing and including means for selectively utilizing any one of said oscillation frequencies, and a second heterodyning means for combining said first intermediate frequency and a preselected crystal controlled oscillation frequency whereby there is produced a second intermediate frequency in the vicinity of said prescribed center frequency, said frequency discriminator being responsive to control the output of said variable oscillator only when said second intermediate frequency deviates from said prescribed center frequency.

References Cited in the file of this patent

UNITED STATES PATENTS

| | | |
|---|---|---|
| 2,398,694 | Case | Apr. 16, 1946 |
| 2,523,106 | Fairbairn et al. | Sept. 19, 1950 |
| 2,570,461 | Legros | Oct. 9, 1951 |
| 2,685,032 | Cox | July 27, 1954 |
| 2,704,329 | Law | Mar. 15, 1955 |